United States Patent
Sato et al.

(10) Patent No.: US 10,068,985 B2
(45) Date of Patent: Sep. 4, 2018

(54) METHOD FOR MANUFACTURING SEMICONDUCTOR SUBSTRATE, METHOD FOR MANUFACTURING SEMICONDUCTOR DEVICE, SEMICONDUCTOR SUBSTRATE, AND SEMICONDUCTOR DEVICE

(71) Applicants: SANKEN ELECTRIC CO., LTD., Niiza-shi, Saitama (JP); SHIN-ETSU HANDOTAI CO., LTD., Tokyo (JP)

(72) Inventors: Ken Sato, Miyoshi-machi (JP); Hiroshi Shikauchi, Niiza (JP); Hirokazu Goto, Minato-ku (JP); Masaru Shinomiya, Annaka (JP); Keitaro Tsuchiya, Takasaki (JP); Kazunori Hagimoto, Takasaki (JP)

(73) Assignees: SANKEN ELECTRIC CO., LTD., Saitama (JP); SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/300,658

(22) PCT Filed: Mar. 5, 2015

(86) PCT No.: PCT/JP2015/001189
§ 371 (c)(1),
(2) Date: Sep. 29, 2016

(87) PCT Pub. No.: WO2015/155930
PCT Pub. Date: Oct. 15, 2015

(65) Prior Publication Data
US 2017/0117385 A1    Apr. 27, 2017

(30) Foreign Application Priority Data

Apr. 9, 2014   (JP) .................................. 2014-080371

(51) Int. Cl.
H01L 29/66        (2006.01)
H01L 29/778       (2006.01)
(Continued)

(52) U.S. Cl.
CPC .... H01L 29/66462 (2013.01); H01L 21/0254 (2013.01); H01L 21/283 (2013.01);
(Continued)

(58) Field of Classification Search
CPC ..... H01L 29/66462; H01L 2924/13064; H01L 29/7782; H01L 29/66431; H01L 29/778;
(Continued)

(56) References Cited

U.S. PATENT DOCUMENTS 7,923,742 B2 *   4/2011   Ohno ..................... B82Y 20/00
                                                      257/98
9,608,075 B1 *   3/2017   Wan ....................... H01L 29/207
(Continued)

FOREIGN PATENT DOCUMENTS

JP    H08-264455 A    10/1996
JP    2006-332367 A   12/2006
(Continued)

OTHER PUBLICATIONS

Ikuta et al. (JP 2015-070091), machine translated documents.*
(Continued)

*Primary Examiner* — Yasser A Abdelaziez
(74) *Attorney, Agent, or Firm* — Oliff PLC

(57) ABSTRACT

A method for manufacturing a semiconductor substrate, the semiconductor substrate including: a substrate; an initial layer provided on the substrate; a high-resistance layer provided on the initial layer which is composed of a nitride-based semiconductor and contains carbon; and a channel layer provided on the high-resistance layer which is composed of a nitride-based semiconductor, and at a step of
(Continued)

forming the high-resistance layer, a gradient is given to a preset temperature at which the semiconductor substrate is heated, and the high-resistance layer is formed such that the preset temperature at the start of formation of the high-resistance layer is different from the preset temperature at the end of formation of the high-resistance layer. It is possible to provide the method for manufacturing a semiconductor substrate, which can reduce a concentration gradient of carbon concentration in the high-resistance layer and also provide a desired value for the carbon concentration.

8 Claims, 9 Drawing Sheets

(51) Int. Cl.
| | | |
|---|---|---|
| *H01L 29/205* | (2006.01) | |
| *H01L 21/283* | (2006.01) | |
| *H01L 29/423* | (2006.01) | |
| *H01L 21/02* | (2006.01) | |
| *H01L 29/20* | (2006.01) | |
| *H01L 29/207* | (2006.01) | |

(52) U.S. Cl.
CPC ........ *H01L 29/2003* (2013.01); *H01L 29/205* (2013.01); *H01L 29/207* (2013.01); *H01L 29/42356* (2013.01); *H01L 29/7787* (2013.01)

(58) Field of Classification Search
CPC ............. H01L 29/7786; H01L 21/0254; H01L 29/2003; H01L 33/007; H01L 31/03048; H01L 31/1856; H01L 2924/10355; H01L 2924/10356; H01L 2924/10357; H01L 2924/10358; H01L 21/20; H01L 21/2205; H01L 29/1041; H01L 29/105; H01S 5/3205

See application file for complete search history.

(56) References Cited

U.S. PATENT DOCUMENTS

| | | | |
|---|---|---|---|
| 2009/0189190 A1 | 7/2009 | Hashimoto et al. | |
| 2010/0123139 A1 | 5/2010 | Sato | |
| 2013/0069208 A1 | 3/2013 | Briere | |
| 2015/0206962 A1* | 7/2015 | Chen | ................... H01L 21/0251 257/76 |
| 2015/0357419 A1* | 12/2015 | Lutgen | ................ H01L 21/0254 257/22 |
| 2016/0043178 A1* | 2/2016 | Liu | ........................ C30B 25/183 257/76 |
| 2016/0118488 A1* | 4/2016 | Nagahisa | ............ H01L 29/7786 257/76 |

FOREIGN PATENT DOCUMENTS

| | | |
|---|---|---|
| JP | 2010-123800 A | 6/2010 |
| JP | 5064824 B2 | 10/2012 |
| JP | 2013-070053 A | 4/2013 |
| JP | 2013-197357 A | 9/2013 |
| JP | 2015-070091 A | 4/2015 |
| JP | 2015070091 * | 4/2015 |

OTHER PUBLICATIONS

Mar. 2, 2017 Taiwanese Office Action issued in Taiwanese Patent Application No. 104107960.
Apr. 28, 2015 International Search Report issued in International Patent Application No. PCT/JP2015/001189.
Aug. 15, 2017 Office Action issued in Japanese Application No. 2014-080371.

* cited by examiner

METHOD FOR MANUFACTURING SEMICONDUCTOR SUBSTRATE, METHOD FOR MANUFACTURING SEMICONDUCTOR DEVICE, SEMICONDUCTOR SUBSTRATE, AND SEMICONDUCTOR DEVICE

BACKGROUND OF THE INVENTION

1. Field of the Invention

The present invention relates to a method for manufacturing semiconductor substrate, a method for manufacturing semiconductor device, a semiconductor substrate, and a semiconductor device.

2. Description of the Related Art

A semiconductor substrate using a nitride semiconductor is used in a power device or the like which operates with a high frequency and a high output power. In particular, as a power device which is suitable to perform amplification in a high-frequency band of microwaves, submillimeter waves, millimeter waves, and others, for example, a high electron mobility transistor (HEMT) or the like is known.

As the semiconductor substrate using the nitride semiconductor, there is known a semiconductor substrate having an initial layer, a GaN layer, and a barrier layer composed of AlGaN sequentially stacked on a Si substrate.

In a lower layer (a high-resistance layer) in the GaN layer, when electrical resistances in a longitudinal direction and a lateral direction are increased, off characteristics of a transistor can be improved, and a longitudinal direction leak current is suppressed, thereby realizing a high breakdown voltage. Thus, carbon is doped, a deep level is formed in a GaN crystal, and n-type conduction is suppressed.

On the other hand, an upper layer (approximately 1 μm) in the GaN layer functions as a channel layer and it can be a cause of current collapse (a phenomenon that reproducibility of output current characteristics is degraded) when a level to trap a carrier is formed, and hence concentration of carbon and the like is sufficiently reduced (see Patent Literature 1-3).

CITATION LIST

Patent Literatures

Patent Literature 1: Japanese Patent No. 5064824
Patent Literature 2: Japanese Unexamined Patent Application Publication (Kokai) No. 2006-332367
Patent Literature 3: Japanese Unexamined Patent Application Publication (Kokai) No. 2013-070053

SUMMARY OF THE INVENTION

As described above, the high-resistance layer is used to suppress a longitudinal direction (a thickness direction) leak current of a device and improve the off characteristics of the transistor by increasing the carbon concentration, but conversely the leak current increases as shown in FIG. 6 by increasing the carbon concentration too much. It is to be noted that FIG. 6 is a view showing carbon concentration dependence of the longitudinal direction leak current when $V_{DS}=800$ V.

As can be understood from FIG. 6, regarding leak current characteristics, the carbon concentration in the high-resistance layer has an optimum value. Thus, when the carbon concentration in the high-resistance layer has a concentration gradient, a region of the carbon concentration deviating from the optimum value is partially used.

Further, the carbon concentration and crystallinity have a correlation to a growth temperature of the nitride semiconductor (see FIGS. 7 and 8: when the growth temperature lowers, the carbon concentration increases, and the crystallinity decreases).

Thus, the present inventors have focused on that the carbon concentration and the crystallinity have the correlation to the growth temperature of the nitride semiconductor, and a preset temperature is fixed as shown in FIG. 9 to suppress a change in carbon concentration during GaN growth of the high-resistance layer, but an actual substrate temperature is lowered approximately 20° C. from the initial layer side toward the channel layer side.

As a reason for this, it is considered that, as growth of the nitride semiconductor advances, a warpage of the semiconductor substrate increases on a negative side ("a warpage is negative" means that the substrate convexly warpages), a central portion of the semiconductor substrate moves away from a substrate holding base which also functions as a heater, the actual substrate temperature thereby lowers.

When a concentration profile in a depth direction of the semiconductor substrate which is fabricated in an above-described manner is measured, the carbon concentration in the high-resistance layer increases from the initial layer side toward the channel layer side, and the cause thereof is considered to be that the substrate temperature lowers from the initial layer side toward the channel layer side.

When the carbon concentration in the high-resistance layer has the concentration gradient in this manner, a region of the carbon concentration deviating from a desired optimum value is partially used in no small measure as described above, and there arises a problem that sufficiently low leak current characteristics cannot be obtained when such a semiconductor substrate is used to fabricate a semiconductor device.

Thus, in view of the above-described problem, it is an object of the present invention to provide a method for manufacturing a semiconductor substrate, which enables reducing a concentration gradient of carbon concentration in a high-resistance layer and allows the carbon concentration to have a desired value.

To achieve the object, the present invention provides a method for manufacturing a semiconductor substrate, the semiconductor substrate including: a substrate; an initial layer provided on the substrate; a high-resistance layer provided on the initial layer which is composed of a nitride-based semiconductor and contains carbon; and a channel layer provided on the high-resistance layer which is composed of a nitride-based semiconductor, wherein, at a step of forming the high-resistance layer, a gradient is given to a preset temperature at which the semiconductor substrate is heated, and the high-resistance layer is formed such that the preset temperature at the start of formation of the high-resistance layer is different from the preset temperature at the end of formation of the high-resistance layer.

As described above, when the present temperature at which the semiconductor substrate is heated is provided with the gradient, a change in substrate temperature during growth of the high-resistance layer can be reduced even if the semiconductor substrate warpages, and the concentration gradient of the carbon concentration in the high-resistance layer can be reduced, and hence selecting the present temperature of the semiconductor substrate such that the optimum substrate temperature is realized to provide an optimum value for the carbon concentration in the high-resistance layer enables providing the sufficiently low leak current characteristics when a semiconductor device is fabricated with the use of the semiconductor substrate which is fabricated in this manner.

At this time, it is preferable, at the step of forming the high-resistance layer, to set the present temperature at the start of formation of the high-resistance layer to be different from the preset temperature at the end of formation of the high-resistance layer such that a reduction in temperature caused due to a warpage of the semiconductor substrate is canceled out.

When the temperature settings during formation of the high-resistance layer are performed in this manner, a change in substrate temperature during growth of the high-resistance layer can be further effectively reduced.

At this time, it is preferable to set the preset temperature at the end of formation of the high-resistance layer to be higher than the preset temperature at the start of formation of the high-resistance layer.

When the temperature settings during formation of the high-resistance layer are performed in this manner, a change in substrate temperature during growth of the high-resistance layer can be further assuredly reduced.

At this time, it is preferable to set a thickness of the high-resistance layer to 500 nm or more and 3 μm or less.

The leak current characteristics can be prevented from deteriorating when the thickness of the high-resistance layer is 500 nm or more, and the semiconductor substrate can be prevented from being extremely thick when the thickness of the high-resistance layer is 3 μm or less.

Moreover, the present invention provides a method for manufacturing a semiconductor device which uses a semiconductor substrate manufactured by the above-described method for manufacturing a semiconductor substrate further including forming electrodes on the channel layer of the semiconductor substrate.

According to the above-described method for manufacturing a semiconductor device using the semiconductor substrate manufactured by the method for manufacturing a semiconductor substrate of the present invention, a change in substrate temperature during growth of the high-resistance layer can be reduced, and a concentration gradient of carbon concentration in the high-resistance layer can be decreased, and hence sufficiently low leak current characteristics can be provided by selecting an optimum value for the carbon concentration in the high-resistance layer.

Additionally, the present invention provides a semiconductor substrate including: a substrate; an initial layer provided on the substrate; a high-resistance layer provided on the initial layer which is composed of a nitride-based semiconductor and contains carbon; and a channel layer provided on the high-resistance layer which is composed of a nitride-based semiconductor, wherein, in the high-resistance layer, a carbon concentration gradient defined by {(carbon concentration on the initial layer side)−(carbon concentration on the channel layer side)}/(a film thickness of the high-resistance layer) is $1\times10^{18}$ atoms/cm$^3$·μm or more and $1\times10^{19}$ atoms/cm$^3$·μm or less.

If the carbon concentration gradient in the high-resistance layer falls within the above-described range, selecting an optimum value for the carbon concentration in the high-resistance layer enables providing the sufficiently low leak current characteristics when a semiconductor device is fabricated by using such a semiconductor substrate.

At this time, carbon concentration in the high-resistance layer can be set to $1\times10^{17}$ atoms/cm$^3$ or more and $1\times10^{20}$ atoms/cm$^3$ or less.

As the carbon concentration in the high-resistance layer, such a concentration range can be preferably used.

Further, the present invention provides a semiconductor device fabricated by using the above described semiconductor substrate, wherein electrodes are provided on the channel layer.

According to the above-described semiconductor device fabricated by using the semiconductor substrate of the present invention, when a preset temperature of the semiconductor substrate is selected such that an optimum substrate temperature which realizes an optimum value for the carbon concentration in the high-resistance layer is provided, the sufficiently low leak current characteristics can be provided.

As described above, according to the method for manufacturing a semiconductor substrate of the present invention, since a change in substrate temperature during growth of the high-resistance layer can be reduced and the concentration gradient of the carbon concentration in the high-resistance layer can be decreased, selecting the preset temperature of the semiconductor substrate such that an optimum substrate temperature which realizes an optimum value for the carbon concentration in the high-resistance layer can be provided enables providing the sufficiently low leak current characteristics when the semiconductor device is fabricated by using the thus fabricated semiconductor substrate.

DETAILED DESCRIPTION OF THE PREFERRED EMBODIMENTS

Figure 6:
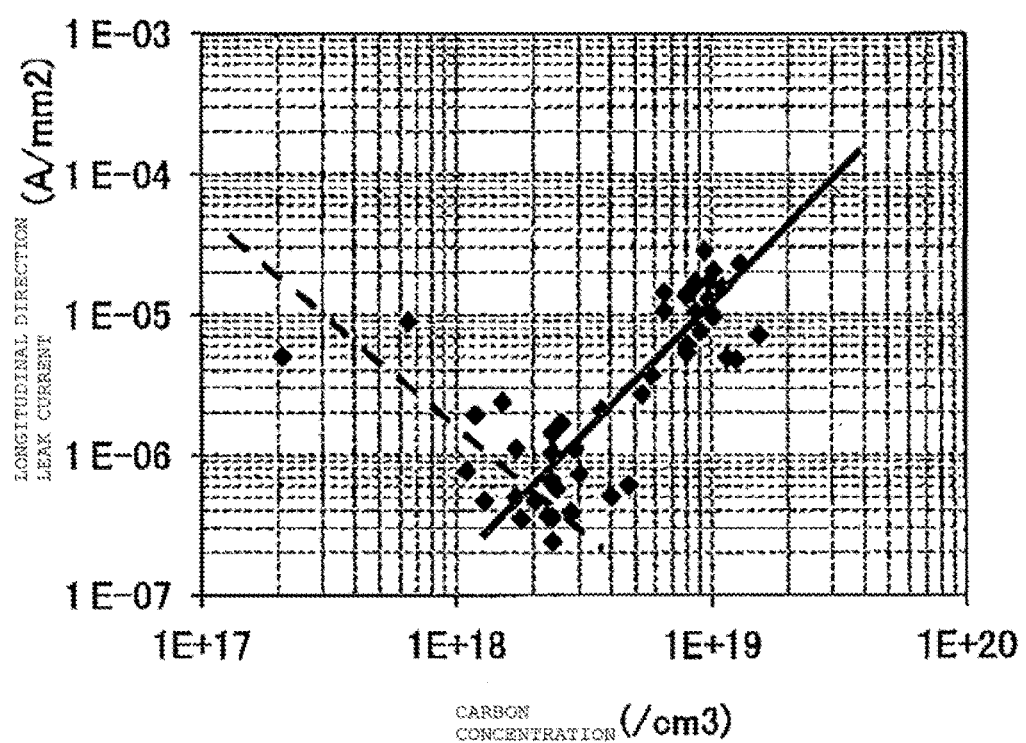
FIG. 6 is a view showing carbon concentration dependence of a longitudinal direction leak current.
Figure 7:
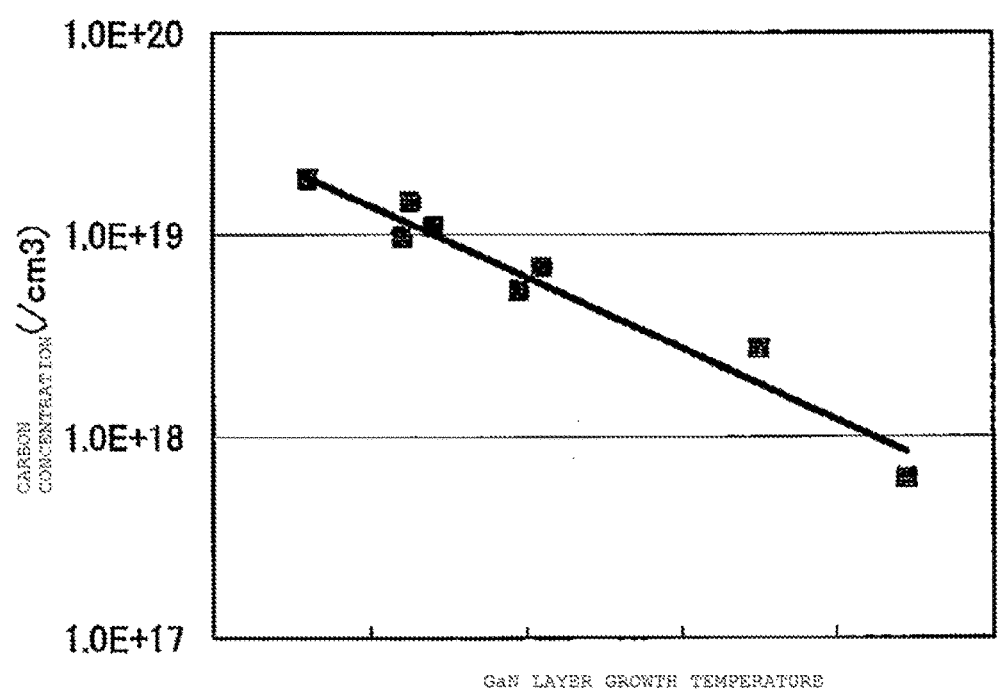
FIG. 7 is a view showing growth temperature dependence of carbon concentration.
Figure 8:
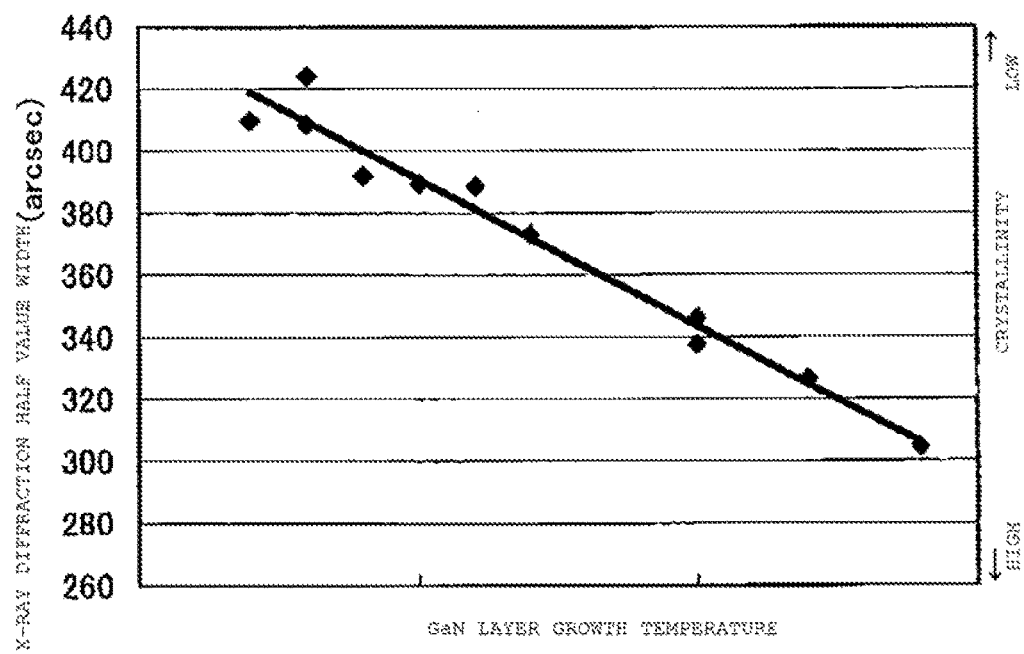
FIG. 8 is a view showing growth temperature dependence of crystallinity of a high-resistance layer.

As described above, a high-resistance layer is used to suppress a longitudinal direction leak current of a device and improve off characteristics of a transistor by increasing carbon concentration, but the carbon concentration of the high-resistance layer has an optimum value in relation to leak current characteristics as shown in FIG. 6. Thus, when the carbon concentration in the high-resistance layer has a concentration gradient, a region of the carbon concentration deviating from a desired optimum value is partially used in no small measure, resulting in a problem that sufficiently low leak current characteristics cannot be obtained when a semiconductor device is fabricated by using such a semiconductor substrate.

Thus, the present inventors have keenly studied about a method for manufacturing a semiconductor substrate which enables reducing the concentration gradient of the carbon concentration in the high-resistance layer and providing a desired value for the carbon concentration. As a result, the present inventors have found out that, when a preset temperature at which the semiconductor substrate is heated during growth of the high-resistance layer is provided with a gradient, a change in substrate temperature during growth of the high-resistance layer can be reduced, the carbon gradient of the carbon concentration in the high-resistance layer can be thereby decreased, and selecting the present temperature of the semiconductor substrate such that an optimum substrate temperature which realizes an optimum value for the carbon concentration in the high-resistance layer is provided enables providing the sufficiently low longitudinal direction leak current characteristics when the semiconductor device is fabricated by using the thus fabricated semiconductor substrate, thereby bringing the present invention to completion.

The present invention will now be explained as an example of an embodiment in detail hereinafter with reference to the drawings, but the present invention is not restricted thereto.

First, a semiconductor substrate which is an example of the present invention will now be explained with reference to FIGS. 3 and 4.

Figure 3:
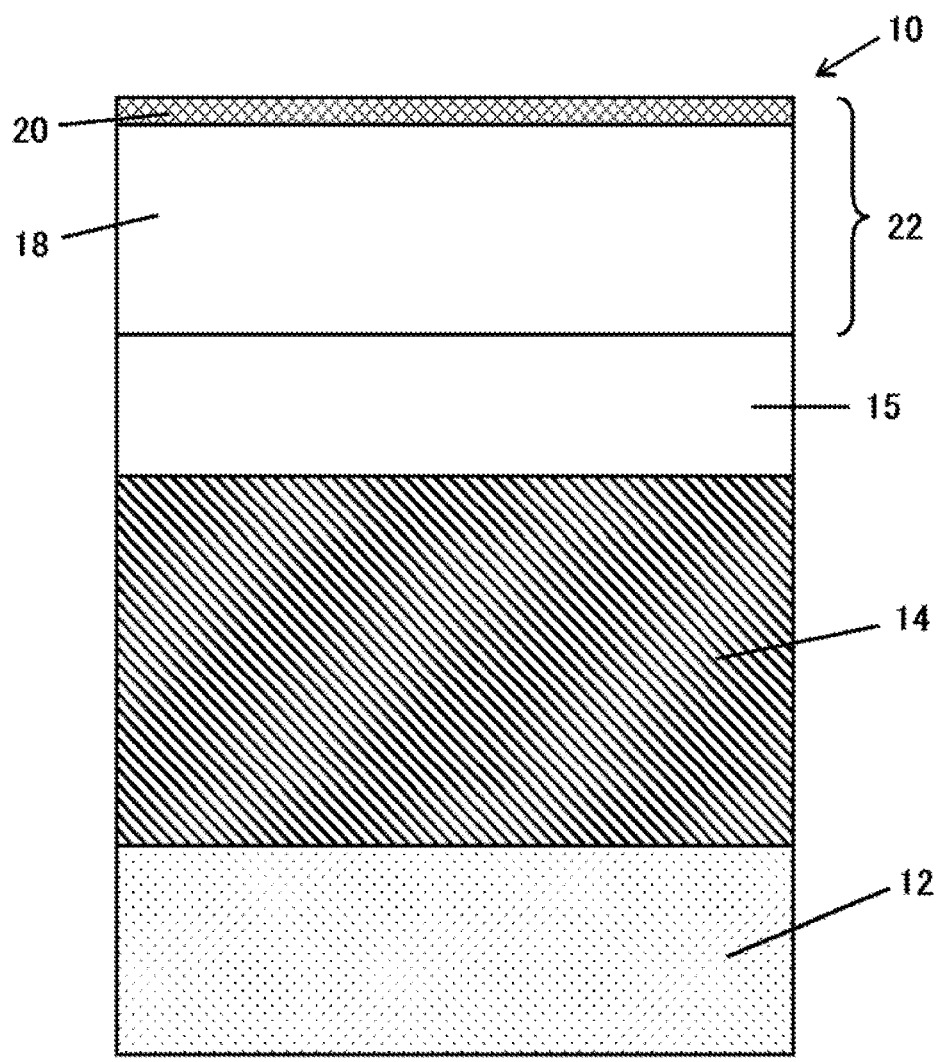
FIG. 3 is a cross-sectional view of a semiconductor substrate showing an example of an embodiment of the present invention.
Figure 4:
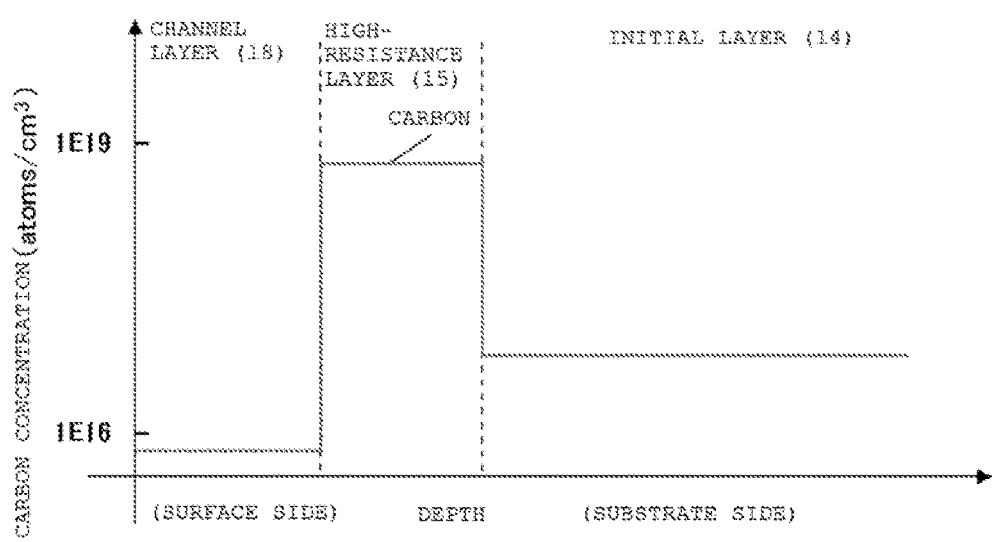
FIG. 4 is a view of a concentration distribution of the semiconductor substrate in a depth direction showing an example of an embodiment of the present invention.

FIG. 3 is a cross-sectional view of a semiconductor substrate which is an example of the present invention, and FIG. 4 is a view showing a concentration distribution in a depth direction of a semiconductor substrate which is an example of the present invention.

A semiconductor substrate 10 shown in FIG. 3 has a substrate 12, an initial layer (a buffer layer) 14 provided on the substrate 12, a high-resistance layer 15 provided on the initial layer 14 which is composed of a nitride-based semiconductor (e.g., GaN) and contains carbon as an impurity, and an active layer 22 provided on the high-resistance layer 15.

Here, the substrate 12 is a substrate composed of, e.g., Si or SiC. Further, the initial layer 14 is a buffer layer constituted of, e.g., a stacked body in which a first layer composed of a nitride-based semiconductor and a second layer composed of a nitride-based semiconductor different from that of the first layer in composition are repeatedly stacked.

The first layer is composed of, e.g., $Al_yGa_{1-y}N$, and the second layer is composed of, e.g., $Al_xGa_{1-x}N$ ($0 \leq x < y \leq 1$).

Specifically, the first layer can be composed of AlN, and the second layer can be composed of GaN.

The active layer 22 has a channel layer 18 composed of a nitride-based semiconductor, and a barrier layer 20 which is provided on the channel layer 18 and composed of a nitride-based semiconductor. The channel layer 18 is composed of, e.g., GaN, and the barrier layer 20 is composed of, e.g., AlGaN.

In the high-resistance layer 15, a carbon concentration gradient defined by {(carbon concentration on the initial layer 14 side)–(carbon concentration on the channel layer 18 side)}/(a film thickness of the high-resistance layer 15) is $1 \times 10^{18}$ atoms/cm$^3$·μm or more and $1 \times 10^{19}$ atoms/cm$^3$·μm or less, or preferably $1 \times 10^{18}$ atoms/cm$^3$·μm or more and $5 \times 10^{18}$ atoms/cm$^3$·μm or less.

It is to be noted that, in order to raise electron mobility and suppress current collapse, the carbon concentration in the channel layer 18 can be set to approximately $1 \times 10^{16}$ atoms/cm$^3$ or less.

If the carbon concentration gradient in the high-resistance layer 15 falls within the above-described range, selecting an optimum value for the carbon concentration in the high-resistance layer 15 enables providing sufficiently low leak current characteristics when a semiconductor device is fabricated by using such a semiconductor substrate.

Furthermore, the carbon concentration in the high-resistance layer 15 can be set to $1 \times 10^{17}$ atoms/cm$^3$ or more and $1 \times 10^{20}$ atoms/cm$^3$ or less.

As the carbon concentration in the high-resistance layer, such a concentration range can be preferably used.

Next, a semiconductor device which is an example of the present invention will now be explained with reference to FIG. 5.

Figure 5:
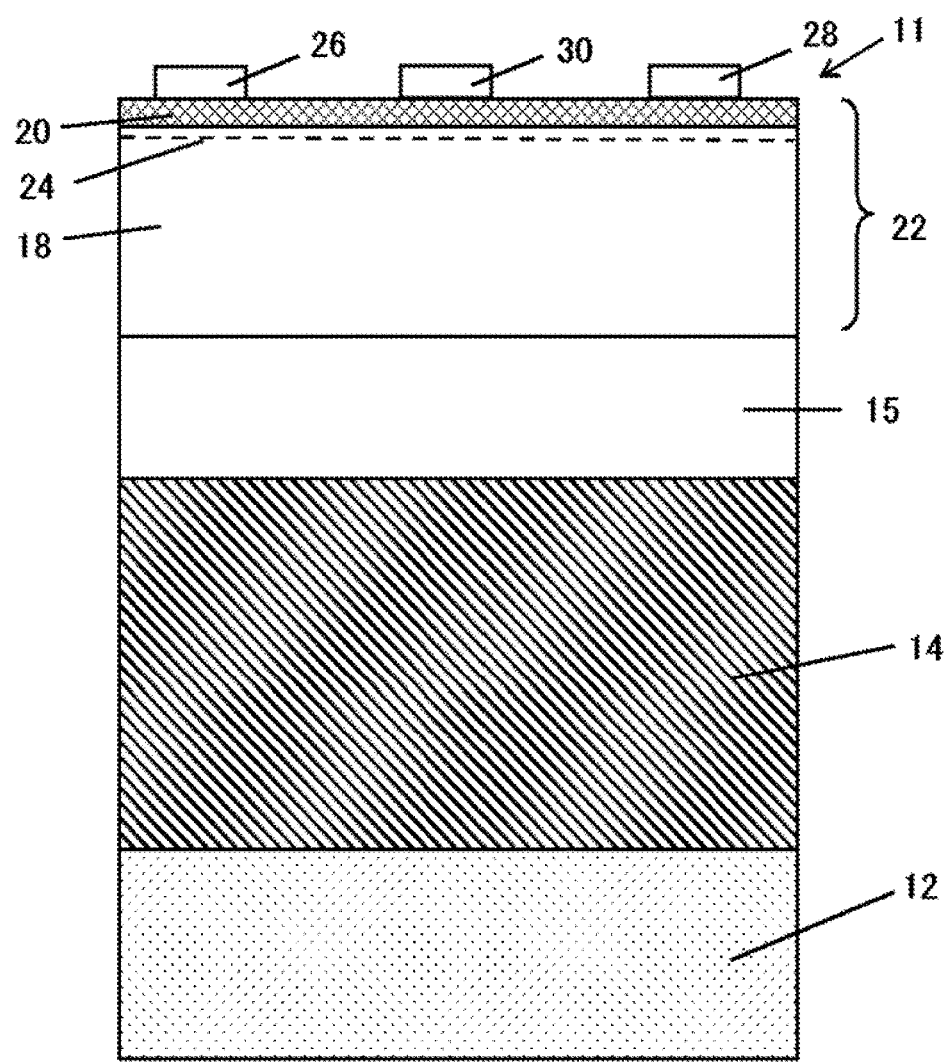
FIG. 5 is a cross-sectional view of a semiconductor device showing an example of an embodiment of the present invention.

FIG. 5 is a cross-sectional view of a semiconductor device which is an example of the present invention.

A semiconductor device 11 is fabricated by using the semiconductor substrate 10, and has a first electrode 26, a second electrode 28, and a control electrode 30 provided on the active layer 22.

In the semiconductor device 11, the first electrode 26 and the second electrode 28 are arranged such that an electric current flows from the first electrode 26 to the second electrode 28 through a two-dimensional electron gas layer 24 formed in the channel layer 18.

The electric current flowing between the first electrode 26 and the second electrode 28 can be controlled by an electric potential applied to the control electrode 30.

The semiconductor device 11 is fabricated by using the semiconductor substrate 10 of the present invention and adjusted such that the carbon concentration gradient in the high-resistance layer 15 becomes sufficiently small, and hence selecting an optimum value for the carbon concentration in the high-resistance layer 15 enables providing sufficiently low longitudinal direction leak current characteristics.

Next, a method for manufacturing a semiconductor substrate which is an example of the present invention will now be described with reference to FIG. 1 and FIG. 3.

The method for manufacturing a semiconductor substrate which is an example of the present invention is a method for manufacturing such a semiconductor substrate 10 as shown in FIG. 3 having the substrate 12, the initial layer 14 provided on the substrate 12, the high-resistance layer 15 provided on the initial layer which is composed of the nitride-based semiconductor and contains carbon, and the channel layer 18 provided on the high-resistance layer 15 which is composed of the nitride-based semiconductor, and, in a step of forming the high-resistance layer 15, a gradient is given to a preset temperature at which the semiconductor substrate 10 is heated, and the high-resistance layer is formed such that a preset temperature at the start of formation of the high-resistance layer is different from a preset temperature at the end of formation of the high-resistance layer.

Figure 1:
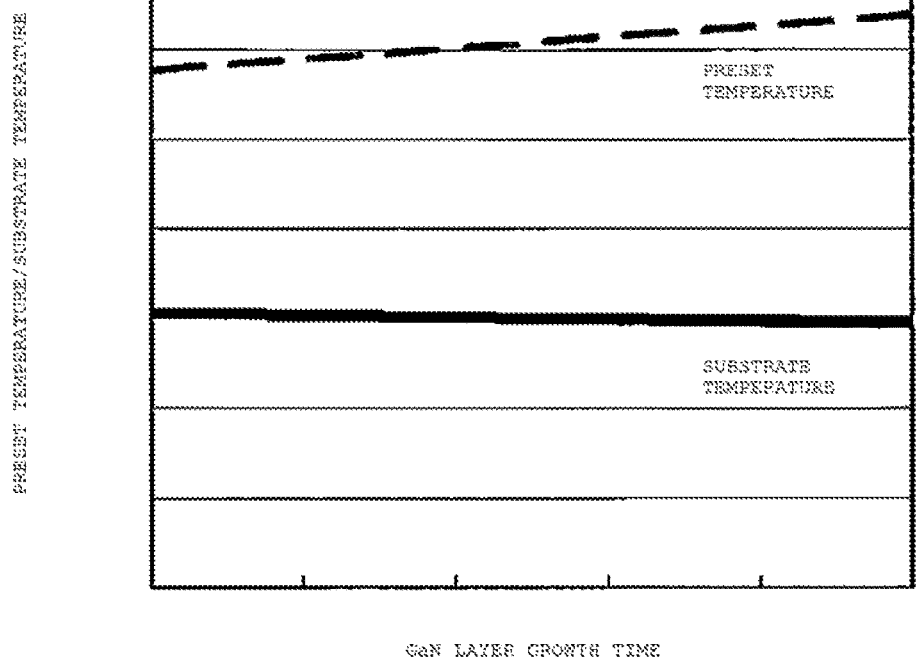
FIG. 1 is a view showing temperature settings in a step of forming a high-resistance layer used in a method for manufacturing a semiconductor substrate of the present invention.
Figure 9:
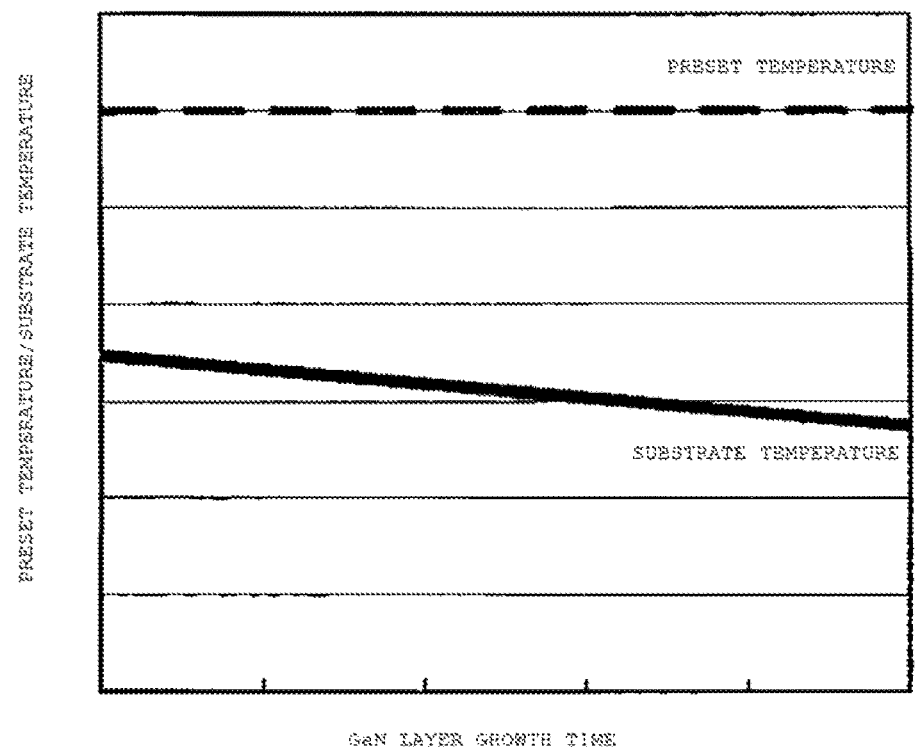
FIG. 9 is a view showing transitions of a preset temperature and a substrate temperature during fabrication of a semiconductor substrate.

For example, in FIG. 9 where the preset temperature during formation of the high-resistance layer is fixed, a substrate temperature during formation of the high-resistance layer is lowered in correspondence with a warpage of the semiconductor substrate but, in FIG. 1 where a temperature gradient is given to a present temperature at which the semiconductor substrate is heated during formation of the high-resistance layer such that a preset temperature at the end of formation of the high-resistance layer is higher than a preset temperature at the start of formation of the high-resistance layer, a substrate temperature during formation of the high-resistance layer is fixed.

When the gradient is given to the present temperature at which the semiconductor substrate is heated during formation of the high-resistance layer in this manner, a change in substrate temperature during growth of the high-resistance layer can be reduced, the concentration gradient of the carbon concentration in the high-resistance layer can be thereby decreased, and hence selecting an optimum value for the carbon concentration in the high-resistance layer 15 enables providing the sufficiently low leak current characteristics when the semiconductor device is fabricated by using the thus fabricated semiconductor substrate.

At the step of forming the high-resistance layer 15, it is preferable to make the present temperature at the start of formation of the high-resistance layer different from the preset temperature at the end of formation of the high-resistance layer such that a decrease in temperature due to a warpage of the semiconductor substrate 10 is canceled out.

When the temperature setting during formation of the high-resistance layer is performed in this manner, a change in substrate temperature during growth of the high-resistance layer can be effectively lowered.

It is preferable to set the preset temperature at the end of formation of the high-resistance layer to be higher than the preset temperature at the start of formation of the high-resistance layer.

When the temperature setting during formation of the high-resistance layer is performed in this manner, a change in substrate temperature during growth of the high-resistance layer can be assuredly reduced.

It is preferable to set a thickness of the high-resistance layer 15 to 500 nm or more and 3 μm or less.

The longitudinal direction leak current characteristics can be prevented from being decreased when the thickness of the high-resistance layer is 500 nm or more, and the semiconductor substrate can be prevented from becoming too thick when the thickness of the high-resistance layer is 3 μm or less.

Next, a method for manufacturing a semiconductor device of to an example of the present invention will now be explained with reference to FIG. 5.

The method for manufacturing a semiconductor device according to the present invention uses the semiconductor substrate 10 manufactured by the above-described method for manufacturing a semiconductor substrate of the present invention and further has a step of forming electrodes 26, 28, and 30 on the channel layer 18 of the semiconductor substrate 10.

According to the method for manufacturing a semiconductor device using the semiconductor substrate manufactured by the method for manufacturing a semiconductor substrate of the present invention, since a change in substrate temperature during growth of the high-resistance layer can be reduced, a concentration gradient of the carbon concentration in the high-resistance layer can be thereby decreased, and hence selecting an optimum value for the carbon concentration in the high-resistance layer enables providing the sufficiently low leak current characteristics.

EXAMPLES

The present invention will now be more specifically explained with reference to an Example and a Comparative Example, but the present invention is not restricted thereto.

Example

Such a semiconductor substrate as shown in FIG. 3 was fabricated by using the above-described method for manufacturing a semiconductor substrate. That is, a gradient was given to a preset temperature so as to set a preset temperature at the end of formation of a high-resistance layer to be higher than a preset temperature at the start of formation of the high-resistance layer.

Further, an actual substrate temperature during formation of the high-resistance layer was measured by a radiation thermometer. FIG. 1 shows its result.

Figure 2:
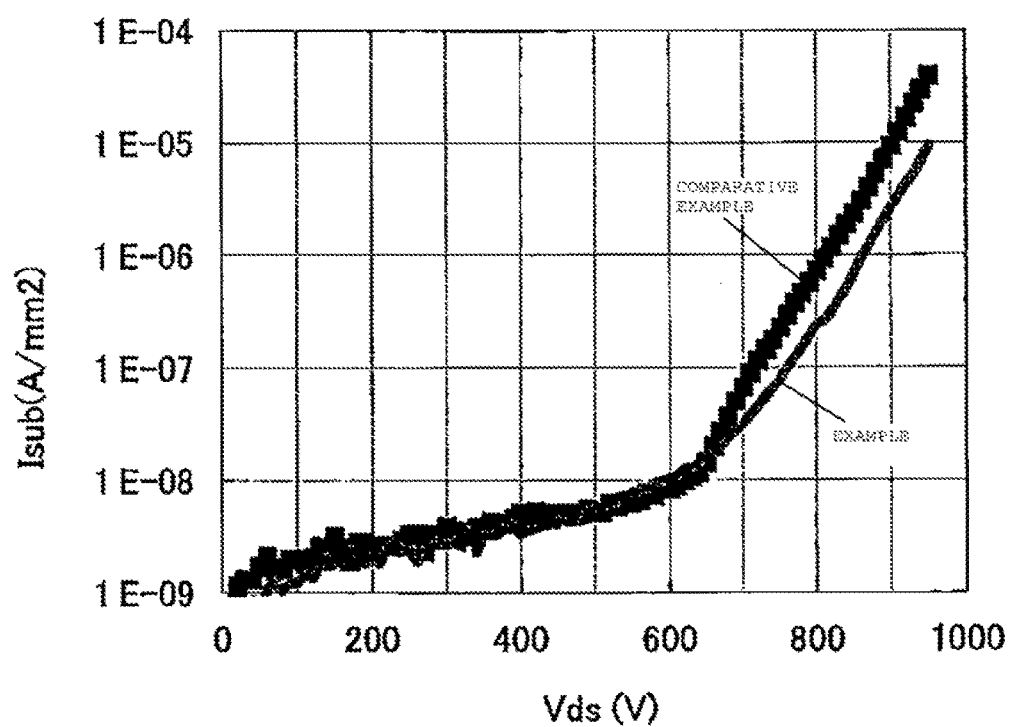
FIG. 2 is a view showing longitudinal direction leak current characteristics of an Example and a Comparative Example.

Furthermore, such a semiconductor device as shown in FIG. 5 was fabricated by using the fabricated semiconductor substrate, and longitudinal direction leak current characteristics of this semiconductor device were measured. FIG. 2 shows its result.

Comparative Example

A semiconductor substrate was fabricated in a same manner as Example. However, a preset temperature during formation of a high-resistance layer was fixed.

Moreover, an actual substrate temperature during formation of the high-resistance layer was measured by a radiation thermometer. FIG. 9 shows its result.

Additionally, such a semiconductor device as shown in FIG. 5 was fabricated by using the fabricated semiconductor substrate, and longitudinal direction leak current characteristic of this semiconductor device were measured. FIG. 2 shows its result.

As can be understood from FIG. 1 and FIG. 9, in Example where the gradient is given to the preset temperature at which the semiconductor substrate is heated during formation of the high-resistance layer, a change in the actual substrate temperature during formation of the high-resistance layer is decreased as compared with Comparative Example where the preset temperature at which the semiconductor substrate is heated during formation of the high-resistance layer is fixed.

As can be understood from FIG. 2, the semiconductor device according to Example has the lower longitudinal direction leak current than that of the semiconductor device according to Comparative Example.

It is to be noted that the present invention is not restricted to the foregoing embodiment. The foregoing embodiment is an illustrative example, and any example which has substantially the same configuration and exerts the same functions and effects as the technical concept described in claims of the present invention is included in the technical scope of the present invention.

The invention claimed is:

1. A method for manufacturing a semiconductor substrate, the semiconductor substrate comprising:
   a substrate;
   an initial layer provided on the substrate;
   a high-resistance layer provided on the initial layer which is composed of a nitride-based semiconductor and contains carbon; and
   a channel layer provided on the high-resistance layer which is composed of a nitride-based semiconductor,
   wherein, at a step of forming the high-resistance layer, a gradient is given to a preset temperature at which the semiconductor substrate is heated, and the high-resistance layer is formed such that the preset temperature at the start of formation of the high-resistance layer is set to be different from the preset temperature at the end of formation of the high-resistance layer such that a reduction in temperature caused due to a warpage of the semiconductor substrate is canceled out.

2. The method for manufacturing a semiconductor substrate according to claim 1,
wherein the preset temperature at the end of formation of the high-resistance layer is set to be higher than the preset temperature at the start of formation of the high-resistance layer.

3. The method for manufacturing a semiconductor substrate according to claim 1,
wherein a thickness of the high-resistance layer is set to 500 nm or more and 3 µm or less.

4. The method for manufacturing a semiconductor substrate according to claim 2,
wherein a thickness of the high-resistance layer is set to 500 nm or more and 3 µm or less.

5. A method for manufacturing a semiconductor device which uses a semiconductor substrate manufactured by the method for manufacturing a semiconductor substrate according to claim 1 further comprising forming electrodes on the channel layer of the semiconductor substrate.

6. A method for manufacturing a semiconductor device which uses a semiconductor substrate manufactured by the method for manufacturing a semiconductor substrate according to claim 2 further comprising forming electrodes on the channel layer of the semiconductor substrate.

7. A method for manufacturing a semiconductor device which uses a semiconductor substrate manufactured by the method for manufacturing a semiconductor substrate according to claim 3 further comprising forming electrodes on the channel layer of the semiconductor substrate.

8. A method for manufacturing a semiconductor device which uses a semiconductor substrate manufactured by the method for manufacturing a semiconductor substrate according to claim 4 further comprising forming electrodes on the channel layer of the semiconductor substrate.

* * * * *